United States Patent [19]
Howard

[11] Patent Number: 6,028,763
[45] Date of Patent: Feb. 22, 2000

[54] CAPACITOR AND METHOD FOR FORMING A CAPACITOR

[75] Inventor: Bradley J. Howard, Boise, Id.

[73] Assignee: Micron Technology, Inc., Boise, Id.

[21] Appl. No.: 09/061,858

[22] Filed: Apr. 17, 1998

Related U.S. Application Data

[62] Division of application No. 08/885,060, Jun. 30, 1997, Pat. No. 5,970,358.

[51] Int. Cl.[7] .............................. H01G 4/008; H01G 4/06
[52] U.S. Cl. .................. 361/305; 361/306.1; 361/321.5; 361/311; 438/396
[58] Field of Search ................................ 361/301.4, 303, 361/305, 306.1, 306.3, 311–313, 321.2, 321.5, 329; 257/528, 532, 534, 304, 307, 308, 309, 310, 306, 311; 438/254–255, 964, 396–398

[56] References Cited

U.S. PATENT DOCUMENTS

| | | | |
|---|---|---|---|
| 5,005,072 | 4/1991 | Gonzalez | 357/306 |
| 5,006,481 | 4/1991 | Chan et al. | 438/253 |
| 5,061,651 | 10/1991 | Ino | 438/253 |
| 5,116,776 | 5/1992 | Chan et al. | 438/396 |
| 5,126,810 | 6/1992 | Gotou | 257/306 |
| 5,135,883 | 8/1992 | Bae et al. | 438/396 |
| 5,158,073 | 10/1992 | Gonzalez et al. | 438/397 |
| 5,170,233 | 12/1992 | Liu et al. | 257/308 |
| 5,192,703 | 3/1993 | Lee et al. | 438/397 |
| 5,416,037 | 5/1995 | Sato et al. | 438/397 |
| 5,441,908 | 8/1995 | Lee et al. | 438/397 |
| 5,460,999 | 10/1995 | Hong et al. | 438/397 |
| 5,573,967 | 11/1996 | Tseng | 438/254 |
| 5,591,664 | 1/1997 | Wang et al. | 438/397 |
| 5,622,882 | 4/1997 | Yee | 438/397 |
| 5,766,995 | 6/1998 | Wu | 438/255 |
| 5,817,555 | 10/1998 | Cho | 438/253 |
| 5,837,579 | 11/1998 | Huang | 438/254 |
| 5,872,033 | 2/1999 | Figura | 438/255 |
| 5,902,124 | 5/1999 | Hong | 438/255 |

OTHER PUBLICATIONS

Ema, T. et al., "3–Dimensional Stacked Capacitor for 16M and 64M Drams", *IEE*, , pp. 592–594 (1988).

Temmler, D., Multilayer Vertical Stacked Capacitors (MVSTC) For 64 Mbit and 256Mbit DRAMs, pp. 13, 14, Institute of Semiconductor Physics, 1200 Frankfurt–Oder, Germany.

Inoue, S. et al., "A Spread Capacitor (SSC) Cell for 65Mbit DRAMs", *IEE*, pp. 31–34 (1989).

Woo, S.H. et al., "Selective Etching Technology of In–Situ P Doped Poly–Si (SEDOP)", *IEE*, pp. 25–26 (1994).

Watanabe, Hidehiro et al., "Stacked Capacitor Cells for High–Density Dynamic RAMs", *IEE*, pp. 600–603 (1988).

Morihara, Toshinori et al., "Disk–Shaped Stacked Capacitor Cell for 256 Mb Dynamic" Random–Access Memory, Jpn. J. Appl. Phys. vol. 33 (1994) Pt. 1, No. 8.

*Primary Examiner*—Kristine Kincaid
*Assistant Examiner*—Anthony Dinkins
*Attorney, Agent, or Firm*—Wells, St. John, Roberts, Gregory & Matkin P.S.

[57] ABSTRACT

A capacitor and method for forming a capacitor is disclosed and which includes providing a node to which electrical connection is to be made; forming a first layer of conductive material to a first thickness over and in electrical connection with the node; forming a second layer of insulative material to a second thickness over the first layer, the second thickness being greater than the first thickness; forming a third layer of conductive material to a third thickness over the second layer; forming the first, second and third layers into a first capacitor plate; and forming a capacitor dielectric layer and second capacitor plate operatively adjacent the first capacitor plate.

3 Claims, 3 Drawing Sheets

6,028,763

CAPACITOR AND METHOD FOR FORMING A CAPACITOR

RELATED PATENT DATA

This application is a divisional application of Ser. No. 08/885,060, which was filed on Jun. 30, 1997 now U.S. Pat. No. 5,970,358.

TECHNICAL FIELD

The present invention relates to a capacitor and method for forming a capacitor.

BACKGROUND OF THE INVENTION

As the memory cell density of DRAMs increases there is a continuous challenge to maintain sufficiently high storage capacitance despite decreasing cell area. Additionally there is a continuing goal to further decrease cell area. The principal way of increasing cell capacitance heretofore has been through cell structure techniques. Such techniques include three dimensional cell capacitors such as trench or stacked capacitors.

Increasing the cell capacitance of a capacitor cell plate is the subject matter of the present application.

SUMMARY OF THE INVENTION

The present invention relates to a capacitor and method for forming a capacitor wherein a pair of electrically conductive layers, which are separated by an intervening insulative layer, are electrically coupled together by an electrically conductive interconnect layer to form a first capacitor plate. An insulative dielectric layer and second capacitor plate are then formed operatively adjacent the first capacitor plate. In the preferred embodiment of the invention the intervening insulative layer is recessed relative to the electrically conductive layers, and a portion of the electrically conductive interconnect layer is received in the recess.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent laws "to promote the progress of science and useful arts" (Article 1, Section 8).

Figure 1:
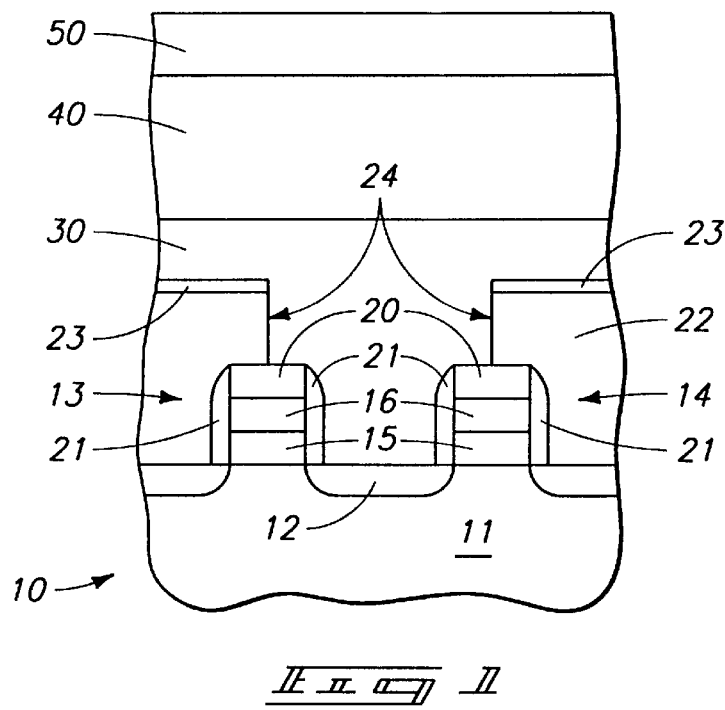
FIG. 1 is a diagrammatic section of a semiconductor wafer shown at one processing step in accordance with the invention.

Referring now to FIG. 1, a semiconductor substrate or wafer is indicated generally by reference to numeral 10. In the context of this document, the term "semiconductor substrate" is defined to mean any construction comprising semiconductive material, including, but not limited to, bulk semiconductive materials such as semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

As seen in FIG. 1, the semiconductor wafer 10 comprises a bulk monocrystalline silicon substrate 11 having a node 12 to which electrical connection is to be made. A pair of word lines 13 and 14 are formed as shown. Such word lines comprise a polysilicon conductive region 15, a higher conductivity silicide region 16, and an electrically insulative oxide or nitride cap 20. Further insulative sidewall spacers 21 are formed outwardly of the polysilicon, and silicide regions 15, and 16 respectively. An electrically insulative layer 22, typically comprising BPSG is formed outwardly of the word lines 13 and 14. Following the formation of the insulative layer 22, a nitride barrier layer 23 is formed outwardly of the insulative layer 22. Thereafter a contact opening 24 is opened to the underlying node 12. Following the formation of the contact opening 24, a first layer of conductive material such as polysilicon 30 is formed atop the nitride barrier layer 23, and over the underlying node 12 thereby making ohmic electrical contact with same. This first electrically conductive layer of polysilicon 30 has a first thickness of about 1500 Angstroms. A second layer of insulative material 40 is formed over the first layer 30. The preferred material of the second layer 40 comprises silicon dioxide, although other materials such as titanium nitride could conceivably be employed. The second layer 40 has a preferred second thickness of about twice the thickness of the first layer 30 or about 3000 Angstroms. Further the second layer 40 is selectively etchable relative to the first layer 30. A third layer of conductive material 50 is formed outwardly of the second layer 40. The third layer 50 may be fabricated from the same material as the first layer 30, or from a different material. The second layer 40 is also selectively etchable relative to the third layer 50. It will be recognized, therefore, that the etching rates of the first and third conductive layers may be substantially the same or dissimilar. The third layer 50 has a third thickness which is about equal to the first layer 30 thickness, that is, about 1500 Angstroms. More alternating layers could be provided such that the stack continues to grow.

Figure 2:
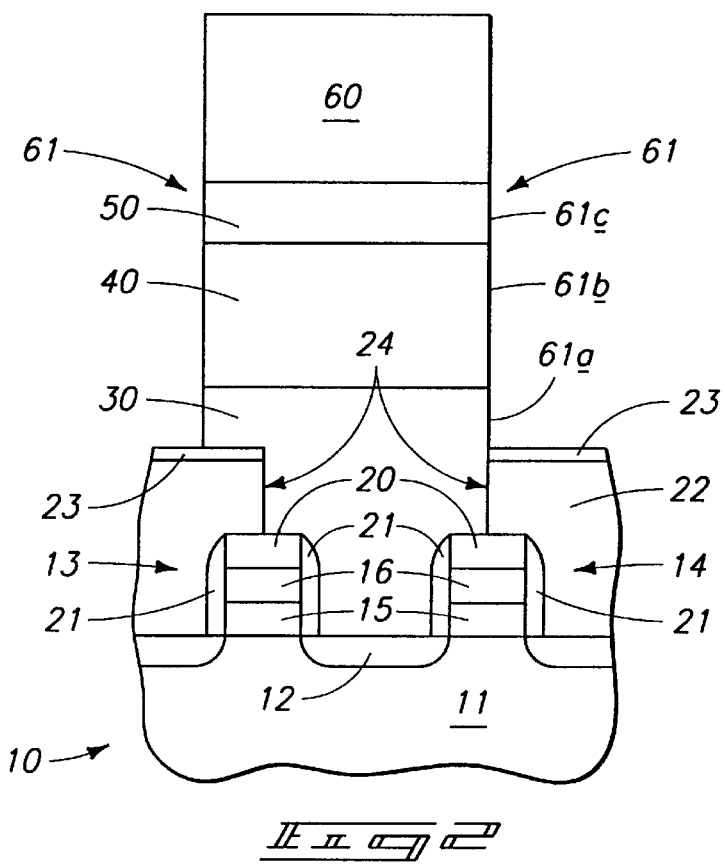
FIG. 2 is a diagrammatic section of a semiconductor wafer shown at a processing step subsequent to that shown in FIG. 1.

Referring now to FIG. 2, a masking layer of photoresist 60 is provided outwardly of the third layer 50. The underlying first, second and third layers 30, 40 and 50 are then subjected to conditions sufficient to pattern the layers into the illustrated shape. The resulting plate-like shape has peripheral sidewalls 61. The respective first second and third layers 30, 40 and 50 each have outwardly facing or peripheral sidewalls which are identified by the numbers 61a, 61b, and 61c respectively.

Figure 3:
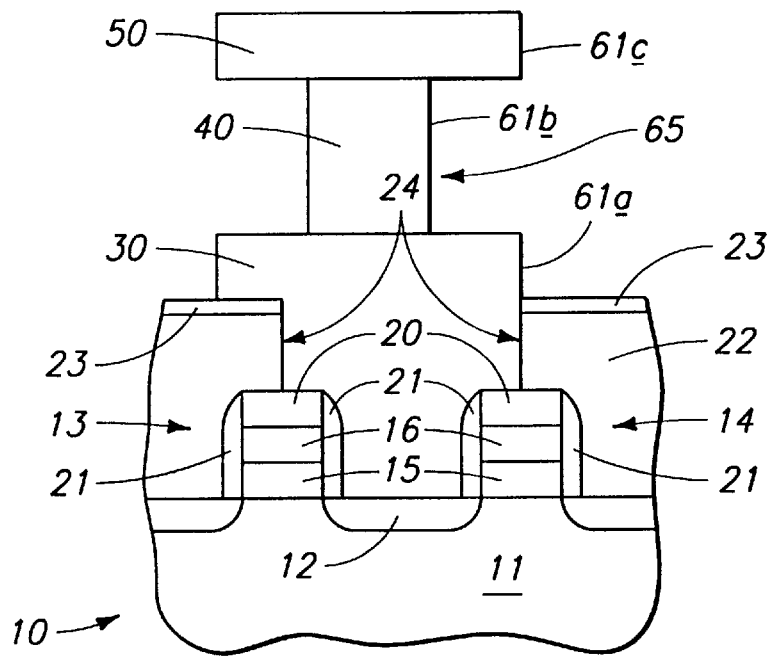
FIG. 3 is a diagrammatic section of a semiconductor wafer shown at a processing step subsequent to that shown in FIG. 2.

Referring now to FIG. 3, conditions are provided to selectively remove the second layer of insulative material 40 relative to the first and third conductive layers 30 and 50 respectively. Exemplary conditions comprise a HF acid solution dip at room temperature, and ambient pressure. The concentration of the HF acid solution lies in a range of about 10:1 to about 100:1. The time of exposure of the semiconductor substrate 10 to the HF acid solution would determine the amount of material removed from the intervening, second insulative layer 40. The conditions are effective to remove a portion of the second insulative layer 40 and thus form the resulting finned structure which has three layers, comprising the first electrically conductive layer 30, a second electrically insulative layer 40 adjacent the second insulative layer, and a third layer 50 atop the second layer 40. As seen in FIG. 3 the first, second and third layers 30, 40 and 50 each have respective outermost peripheral sidewalls, 61a, 61b and 61c and at least a portion of the second layer sidewall 61b is received within the peripheral confines of both the first and third layer sidewalls 61a and 61c respectively. A recess 65 is thus defined between the first and third layers 30 and 50 respectively.

Figure 4:
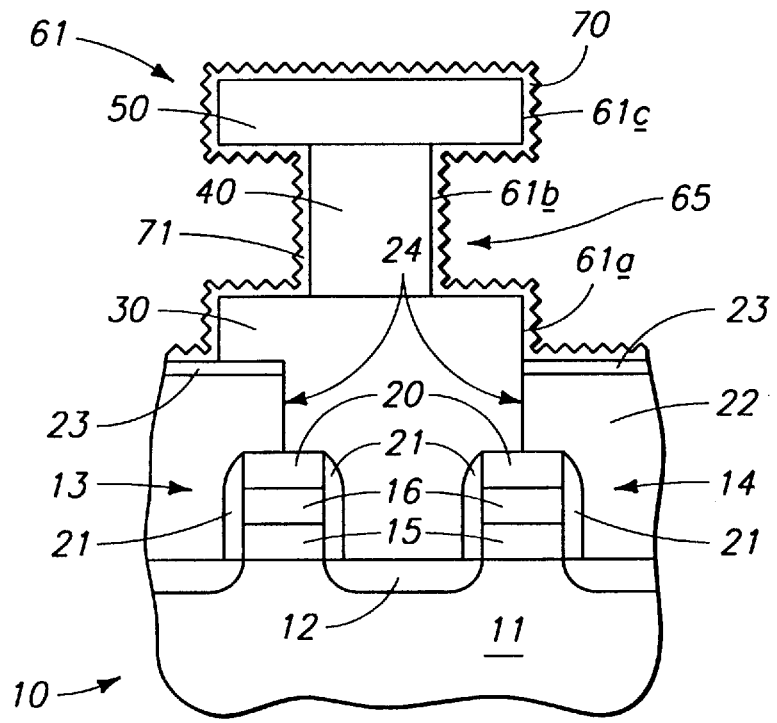
FIG. 4 is a diagrammatic section of a semiconductor wafer shown at a processing step subsequent to that shown in FIG. 3.
Figure 5:
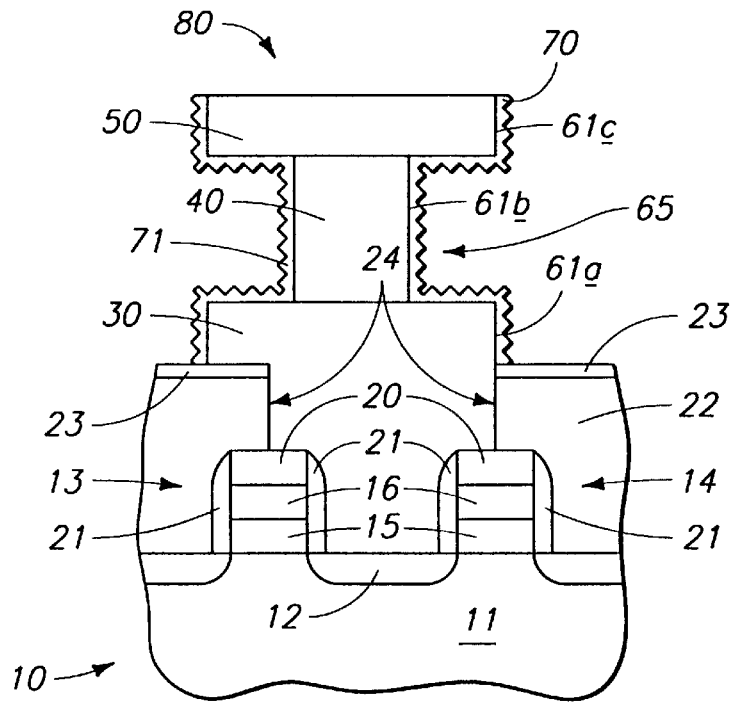
FIG. 5 is a diagrammatic section of a semiconductor wafer shown at a processing step subsequent to that shown in FIG. 4.

Referring now to FIG. 4, a fourth, electrically conductive interconnect layer 70 is formed outwardly of the first, second and third layers 30, 40 and 50 respectively. The electrically conductive interconnect layer 70 comprises, in the preferred form of the invention, a material which increases the capacitance of the resulting first capacitor plate 80, (FIG. 5). Exemplary materials comprise rough polysilicon, and HSG. Other conductive materials could of course be used with equal success. As seen in FIG. 4, the electrically conductive interconnect layer 70 conforms to the underlying first, second and third layers 30, 40 and 50, and a portion 71 of the electrically conductive layer 70 is received within the recess 65 thereby electrically coupling the first and third conductive layers, 30 and 50 together.

Referring now to FIG. 5, following the formation of the electrically conductive interconnect layer 70, a maskless, anisotropic etch is conducted to remove any remaining material comprising the fourth layer 70 from substantially all horizontal surfaces thereby electrically isolating the resulting first capacitor plate 80.

Figure 6:
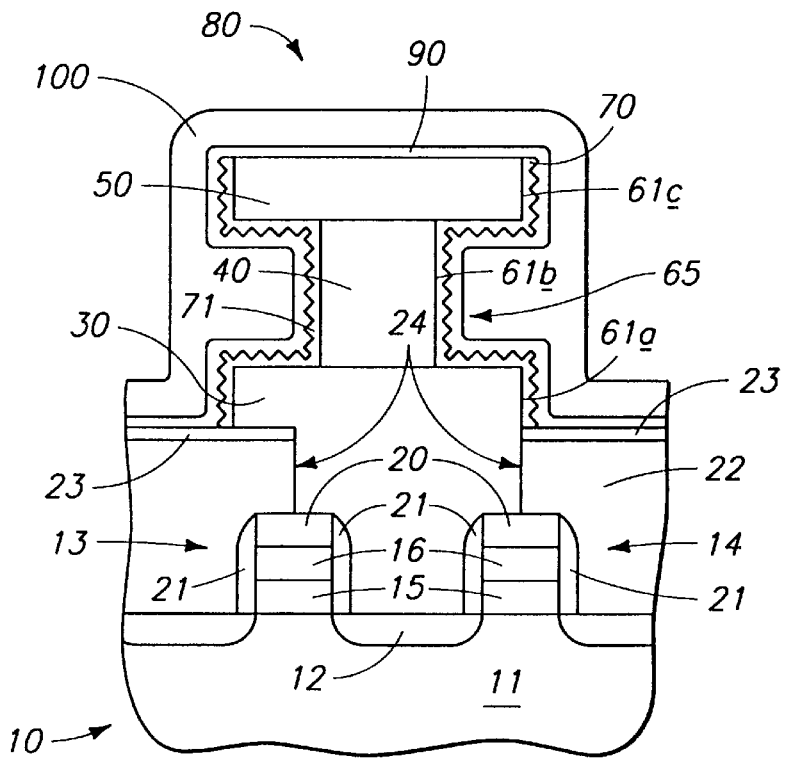
FIG. 6 is a diagrammatic section of a semiconductor wafer shown at a processing step subsequent to that shown in FIG. 5.

Referring now to FIG. 6, following the formation of the first capacitor plate 80, a dielectric layer 90, and a second capacitor plate 100 are formed operatively adjacent and outwardly of the first capacitor plate 80.

In compliance with the statute, the invention has been described in language more or less specific as to structural and methodical features It is to be understood, however, that the invention is not limited to the specific features shown and described, since the means herein disclosed comprise preferred forms of putting the invention into effect. The invention is therefore, claimed in any of its forms or modifications within the proper scope of the appended claims appropriately interpreted in accordance with the Doctrine of Equivalents.

I claim:

1. A capacitor comprising:

a pair of spaced electrically conductive layers, and wherein the pair of spaced electrically conductive layers consist of different materials;

an electrically insulative layer located between the pair of spaced electrically conductive layers and forming a recess therebetween;

an electrically conductive interconnect layer for electrically coupling the pair of spaced electrically conductive layers together, the electrically conductive interconnect layer having a portion which is received in the recess, the pair of spaced electrically conductive layers, electrically insulative layer and electrically conductive interconnect layer comprising a first capacitor plate; and a capacitor dielectric layer and a second capacitor plate operatively adjacent the first capacitor plate.

2. A capacitor comprising:

a first electrically conductive layer having a first thickness, a second electrically insulative layer on the first electrically conductive layer and having a second thickness;

a third electrically conductive layer on the second electrically insulative layer and having a third thickness, and wherein the first and third electrically conductive layers constitute different materials;

an electrically conductive interconnect layer extending over the second electrically insulative layer and electrically coupling the first and the third electrically conductive layers, the first, second, third and electrically conductive interconnect layers comprising a first capacitor plate; and a capacitor dielectric layer and second capacitor plate operatively adjacent the first capacitor plate.

3. A capacitor comprising:

a first capacitor plate having at least three layers, the three layers comprising a first electrically conductive layer, a second electrically insulative layer adjacent the first layer, and a third electrically conductive layer adjacent the second layer, and wherein the first and third layers constitute different materials, and wherein the second insulative layer defines a recess between the first and third conductive layers, and an electrically conductive interconnect layer extending over the second insulative layer and electrically interconnecting the first and third electrically conductive layers; and a capacitor dielectric layer and a second capacitor plate operatively adjacent the first capacitor plate.

* * * * *